United States Patent [19]

Palmer

[11] Patent Number: 4,834,833
[45] Date of Patent: May 30, 1989

[54] MASK FOR ETCHING, AND METHOD OF MAKING MASK AND USING SAME

[76] Inventor: Alan K. Palmer, 23344 - 46th Avenue, Langley, British Columbia, Canada, V3A 4R1

[21] Appl. No.: 127,421

[22] Filed: Dec. 2, 1987

[51] Int. Cl.⁴ .............................................. B44C 1/22
[52] U.S. Cl. .................... 156/631; 430/258; 430/261; 430/320; 430/323; 156/154; 156/240; 156/645; 156/659.1; 156/660; 51/310; 51/312
[58] Field of Search .............. 430/256, 258, 320, 269, 430/323, 261; 51/310, 311, 312; 156/154, 235, 240, 247, 631, 645, 660, 659.1

[56] References Cited

U.S. PATENT DOCUMENTS

| | | | |
|---|---|---|---|
| 4,193,797 | 3/1980 | Cohen et al. | 430/258 |
| 4,430,416 | 2/1984 | Goto et al. | 430/263 |
| 4,456,680 | 6/1984 | Nakamura et al. | 430/258 |
| 4,587,186 | 5/1986 | Nakamura et al. | 430/14 |
| 4,640,727 | 2/1987 | Janssen | 156/240 |

FOREIGN PATENT DOCUMENTS

59-88258  5/1984  Japan ...................................... 51/312

*Primary Examiner*—Jose G. Dees
*Attorney, Agent, or Firm*—Bull, Housser & Tupper

[57] ABSTRACT

A method of etching a surface of an article comprises adhering a negative image bearing film, having a first removable transparent support sheet adhered to an exposure side thereof, to a capillary or second film using a first adhesive. The capillary film has a second removable transparent support sheet adhered to a rear side thereof. A development side of the image bearing film is adhered to a front side of the capillary film opposite the rear side. The first removable transparent support sheet is then removed from the exposure side of the image bearing film and the image bearing and capillary films are sprayed with a solvent which creates a negative image in the capillary film corresponding to the negative image in the negative image bearing film. The two films are thus adhered together and adhered to the second removable transparent support sheet as a mask. The mask is dried and then sprayed with a second adhesive. The second adhesive, when applied to the mask, must have a greater affinity for the surface to which it is to be adhered (i.e. the surface to be etched) than the affinity between the capillary film and the second removable transparent support sheet. The mask is then adhered to the surface of the article and the second removable transparent support sheet is removed from the mask. The mask is then grit blasted so that the image is etched onto the surface in positive. The mask is then removed from the surface.

20 Claims, 3 Drawing Sheets

MASK FOR ETCHING, AND METHOD OF MAKING MASK AND USING SAME

BACKGROUND OF THE INVENTION

This invention relates to a method of etching a surface of an article using grit blasting.

Grit blasting is widely used for etching a surface of an article with a desired image. Steel grit, sand, aluminum oxide or other abrasive material can be propelled against the surface of the article. The article can be constructed of a variety of materials such as glass, stone, ceramics, wood, synthetic resin, metal or leather. To etch the image onto the article, a mask having a pattern corresponding to the desired image can be adhered to the article, followed by etching vacant portions or voids of the image by grit blasting. The present invention is directed to an improved method of etching a surface of an article.

Grit blasting has been effected in the past by employing a pattern mask prepared manually from rubber or paper and attaching the pattern mask to the article to be etched by employing an adhesive. This method is time consuming and cannot be used to etch fine image details on a repetitive basis.

In the past, surfaces of articles have also been etched by adhering an expensive metal template to the surface and grit blasting the template.

The surface of the article can also be etched by silk screen printing an image in relief onto a very fine sticky backing paper. This method requires a very strong ink image. The sticky backing paper is then dampened and then adhered to the surface. The image is then grit blasted. The grit material must, however, penetrate through the paper and its adhesive before affecting the surface. During this time, the ink image must withstand the grit blasting. This method is expensive for short runs and is best suited for long runs (etching the same image on hundreds of different articles).

Another prior art method of etching a surface of an article consists of silk screen printing a thick reverse image onto a carrier sheet and allowing the image to dry. An adhesive is then sprayed onto the image side and the image is then transferred onto the surface to be grit blasted. This method is also expensive for short runs.

U.S. Pat. No. 4,456,680 (Nakamura et al.) discloses a process for preparing a mask for grit blasting. The mask, carried on a destroyable film layer, is adhered to the article to be engraved and is then grit blasted. However, before the grit blast material reaches the article to be engraved, it must penetrate through the destroyable film layer, the mask being disposed between the destroyable film layer and the article to be engraved. The grit blast material must therefore penetrate through the destroyable film layer before the image is engraved onto the surface and accordingly the mask itself deteriorates as the grit blast material penetrates through the destroyable film layer.

U.S. Pat. No. 4,587,186 (Nakamura et al.) is a continuation-in-part of the Nakamura U.S. Pat. No. 4,456,680. The Nakamura U.S. Pat. No. 4,587,186 has the same difficulties as the Nakamura U.S. Pat. No. 4,456,680, although in the later patent the destroyable film layer is weaker so that it is easier to penetrate through. However, even in the Nakamura U.S. Pat. No. 4,587,186 the mask will deteriorate as the grit blast material penetrates through the destroyable film layer.

In addition, the Nakamura U.S. Pat. No. 4,587,186 discloses a thicker photosensitive material and thus more light scattering will take place upon exposure through the image bearing transparency and his material must be thick enough to withstand a certain degree of grit blasting. The light scattering effect has a tendency to thicken or broaden the finer areas in an image, thus reducing resolution of fine detail.

U.S. Pat. No. 4,430,416 (Goto et al.) discloses a transfer element for sand blast carving. The Goto element includes an intermediate resin layer which must be penetrated by the sand blast material prior to etching the surface of the article. The mask element is of a substantial thickness which could result in an inability to produce a fine image.

U.S. Pat. No. 4,193,797 (Cohen et al.) discloses a method for making photo resists. The photo resist is mainly for acid etching and would not be suitable for grit blasting.

SUMMARY OF THE INVENTION

The present invention reduces the difficulties and disadvantages of the prior art by providing two separate films which are adapted to cooperate with each other when the films are sprayed with a solvent to produce a mask of the image which can withstand grit blasting. There is no intermediate destroyable film layer and it is possible to produce a very fine image because one film is very thin and thus light scattering is reduced. The thin film is capable of accepting and carrying a fine image while protecting the other tougher, thicker film while it is being processed with a solvent into the mask. Also, a mask supporting film is removed after the film mask is adhered to the article, and thus the mask is fully exposed prior to grit blasting. Consequently the mask does not have to be subjected to the grit blast material for an unduly long time since it is not necessary to penetrate through a destroyable film layer. The mask is not very time-consuming to produce. In addition, the mask is not very costly to produce since the invention uses readily available films and thus special custom-made films need not be produced.

One embodiment of the present invention provides a method of etching a surface of an article which comprises exposing an exposure side of the first film through a positive image bearing transparency to actinic light so that a latent image is formed on the first film. The first film has a first removable transparent support sheet adhered to the exposure side thereof opposite a development side. The first film is rinsed with a developing means for developing the first film so that a negative image is formed on the first film. The developing side of the first film is then rinsed with a first solvent to remove the developing means and then the first film is allowed to dry. Next, the development side of the first film is adhered to a front side of a second film using a first adhesion means. The second film has a second removable support sheet adhered to a rear side thereof. The first removable transparent support sheet is then removed from the exposure side of the first film, and a second solvent is applied to the first film and the second film which creates a negative image in the second film corresponding to the negative image in the first film. The two films are thus adhered together and adhered to the second removable support sheet as a mask. The mask is dried and a second adhesion means is applied to the mask. The second adhesion means, when applied to the mask, must have a greater affinity for the surface to which the mask is to be adhered than the affinity between the second film and the second removable support sheet. The mask is then adhered to the surface and the second removable support sheet is removed from the mask. The mask is then grit blasted so that the image is etched onto the surface in positive. The mask is then removed from the surface.

A second embodiment of the present invention provides a method of etching a surface of an article which comprises exposing an exposure side of a first film through a positive image bearing transparency to actinic light so that a latent image is formed on the first film. The first film has a first removable transparent support sheet adhered to the exposure side thereof opposite a development side. The first film is rinsed with a developing means for developing the first film so that a negative image is formed on the first film. The first film is then rinsed with a first solvent to remove the developing means and then the first film is allowed to dry. A second removable support sheet is removed from a rear side of a second film to which it is adhered. The rear side of the second film is then adhered to the surface to be etched with a third adhesion means. The development side of the first film is then adhered to the front side of the second film with a first adhesion means. The first adhesion means, when applied to the second film, must have a greater affinity for the first film to which the second film is to be adhered than the affinity between the first film and the first removable transparent support sheet. The first removable transparent support sheet is then removed from the exposure side of the first film. A second solvent is applied to the films when adhered together and adhered to the surface which creates a negative image in the capillary film corresponding to the negative image in the first film. The two films are thus adhered together and adhered to the surface to be etched as a mask. The mask is dried and then grit blasted so that the image is etched onto the surface in positive. The mask is then removed from the surface.

A third embodiment of the present invention provides a method of etching a surface of an article which comprises adhering a negative image bearing film, having a first removable transparent support sheet adhered to an exposure side thereof, to a second film using a first adhesion means. The second film has a second removable support sheet adhered to a rear side thereof. A development side of the image bearing film is adhered to a front side of the second film opposite the rear side. The first removable transparent support sheet is then removed from the exposure side of the image bearing film. A solvent is applied to the image bearing and second films which creates a negative image in the second film corresponding to the negative image in the negative image bearing film. The two films are thus adhered together and adhered to the second removable support sheet as a mask. A second adhesion means is applied to the mask and has a greater affinity for the surface to which the mask is to be adhered than the affinity between the second film and the second removable support sheet. The mask is then adhered to the surface and the second removable support sheet is removed from the mask. The mask is then grit blasted so that the image is etched onto the surface in positive. The mask is then removed from the surface.

A fourth embodiment of the present invention provides a method of etching a surface of an article which comprises removing a second removable support sheet from a rear side of a second film to which it is adhered. The second film is adapted to cooperate with a negative image bearing film when a solvent is applied to the films to produce a mask of the image which can withstand grit blasting. The image bearing film has a first removable transparent support sheet adhered to an exposure side thereof. The rear side of the second film is then adhered to the surface with a third adhesion means. A development side of the image bearing film is then adhered to a front side of the second film with a first adhesion means. The first adhesion means, when applied to the second film, must have a greater affinity for the image bearing film to which the second film is to be adhered than the affinity between the image bearing film and the first removable transparent support sheet. The first removable transparent support sheet is then removed from the image bearing film. A solvent is applied to the films when adhered together and adhered to the surface, which creates a negative image in the capillary film corresponding to the negative image in the negative image bearing film. The two films are thus adhered together and adhered to the surface to be etched as a mask. The mask is dried and then grit blasted so that the image is etched onto the surface in positive. The mask is then removed from the surface.

DESCRIPTION OF THE PREFERRED EMBODIMENT

FIGS. 1-6

This embodiment of the invention is for use with a surface of an article to be etched which could be effected by the first solvent.

Figure 1:
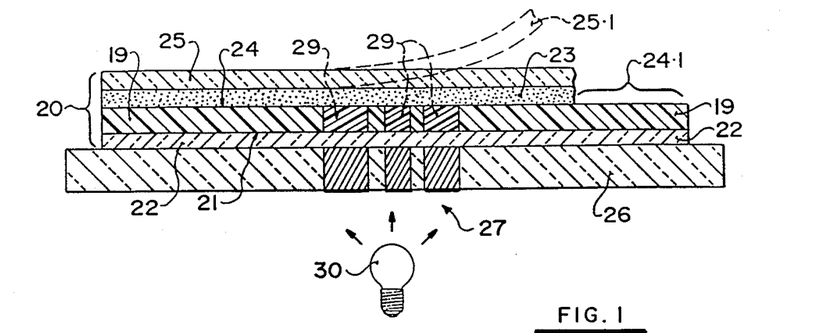
FIG. 1 is an end view of a first embodiment of the invention showing a first film and removal of a protective sheet and light protecting layer from one side thereof, and exposure of an opposite side thereof through a positive image bearing transparency to actinic light.

In FIG. 1, a first film 20 has a first removable transparent support sheet 22 which supports a photosensitive emulsion 19 thereon to provide an exposure or photosensitive side 21 of the first film 20. The term "emulsion" as used herein refers to any substance which can be processed to provide a suitable image. The first film 20 also has a transparent protective sheet 25 adhered to an opposite or development side 24 of the emulsion 19. The exposure side 21 is thus on a side of the first film 20 opposite to the development side 24. An adhesive protective layer 23 is disposed between the development side 24 of the emulsion 19 and the protective sheet 25. The first film 20 can be a film such as an I-N-T (trade mark) film which is a product of the 3M Company of St. Paul, Minn., U.S.A. The I-N-T film is generally used to make transferable art work and associated images in the graphic arts and printing industries. The I-N-T film bearing an image is laid on a work surface and pressure is applied to the I-N-T film causing the image to be transferred from the film to the work surface by a process known as rub-transferring. The I-N-T film, by itself, is relatively thin and fragile and is not tough enough to withstand grit blasting.

The first film 20 could also be a film sold under the trade mark MECANORMA, manufactured by a French company called Mecanorma Industries, or a film sold under the trade mark CHROMATEC manufactured by the Chromatic Corp. of Illinois, United States. These two films require coating with a photosensitive emulsion prior to use. When coated, exposed and developed, they are equivalent to the I-N-T film. The term "first film" includes equivalent types of commercially available film that can be prepared to provide an image which can be adhered by rub-transferring or alternative adhesive means to a compatible work surface.

Referring still to FIG. 1, an image bearing transparency 26 bearing a positive image 27 is placed against the transparent sheet 22 of the film 20. The exposure side 21 is exposed through the image bearing transparency 26 to actinic light 30 (such as 6 Sylvania G.T.E. 850 blacklight 20 watt fluorescent tubes) at a distance of approximately one inch for approximately four minutes. Opaque portions of the image 27 prevent light from impinging the emulsion 19, thus obstructing the photochemical process.

After the exposure side 21 of the first film 20 has been exposed through the image-bearing transparency 26, a latent image 29 is formed in the emulsion 19 of the first film 20. The protective sheet 25, shown in broken outline at 25.1, is carefully peeled away from the development side 24 of the first film. The development side of the first film is then rinsed with a first solvent, such as water, which removes the protective layer 23, and reveals the side 24, shown partially in an intermediate stage as 24.1. The first film 20 is then treated with appropriate developing means. If the first film is the I-N-T film, the appropriate developing means would be the appropriate 3M Company developer. The development side 24 of the first film is then further rinsed with the first solvent to remove the developing means and the undeveloped emulsion, and is then allowed to dry.

Figure 2:
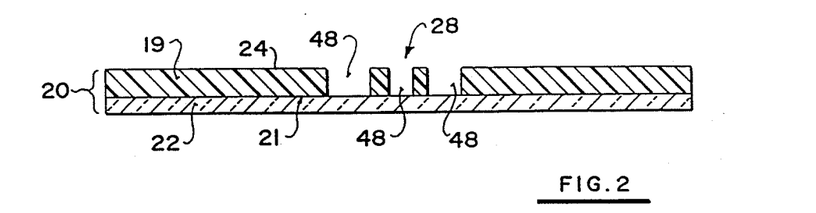
FIG. 2 is an end view of the first film after development thereof the first film now bearing a negative image.

Referring to FIG. 2, after development, the latent image 29 has developed into a negative image 28 by selective removal of obstructed portions of the emulsion 19, which leaves voids 48. FIG. 2 shows remnants of developed emulsion and the voids which form opaque and clear portions respectively of the negative image 28. The first removable transparent support sheet 22 supports the image on the exposure side 21 of the first film.

Figure 3:
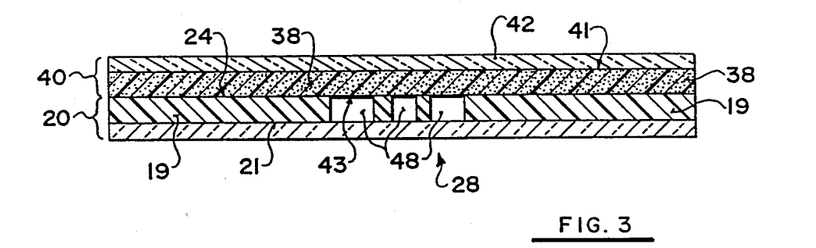
FIG. 3 is an end view of a development side of the first film of FIG. 2 adhered to a front side of a capillary film.

Referring to FIG. 3, a capillary or second film 40 is then selected and cut to size to match size of the first film. The capillary film has a capillary emulsion 38 having a front side 43 and a rear side 41. A second removable transparent support sheet 42 is adhered to, and supports the rear side 41 of the emulsion 38. The development side 24 of the first film is then adhered carefully to the front side 43 of the capillary film by rub-transferring the first film to the capillary film. This forms a combination of the two films as shown in FIG. 3, in which the capillary emulsion 38 is in intimate contact with the remants of the photosensitive emulsion 19. It is noted that the development side 24 has an integral or inherent adhesive which is activated after the protective sheet 25 is removed, as shown at 25.1 of FIG. 1, and during the development of the first film. This integral adhesive serves as a first adhesion means in combination with the rub-transferring for adhering the two emulsions of the two films together as the combination. The emulsion combination at this stage is relatively well protected by being sandwiched between the support sheets 22 and 42.

The capillary film 40 can be a CAPILLEX (trade mark) film which is manufactured by Autotype USA, a company of Illinois, United States. The CAPILLEX film is available in a variety of thickness (i.e. from 18–50 microns). The capillary film 40 can also be an ULANO (trade Mark) CDF-4 film manufactured by the ULANO Group of Companies of Zurich, Switzerland.

The capillary film 40 is conventionally used as a photoresist which is applied to a silkscreen, then exposed to ultra violet light through a negative or positive image to create an usable image in the silkscreen. When used conventionally, the capillary film 40 is supported by the silkscreen. The thickness of the capillary film 40 to be used herein depends upon the expected amount of grit blasting which will occur.

Figure 4:
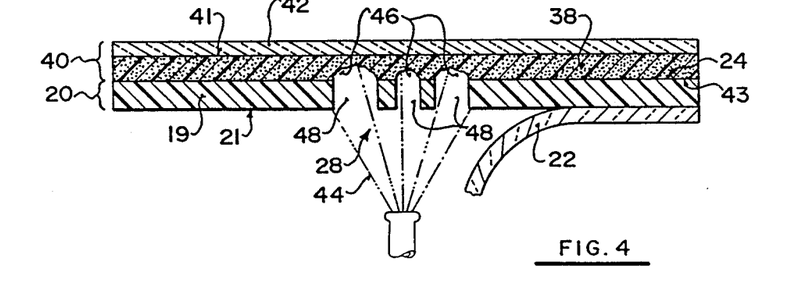
FIG. 4 is an end view of the first and capillary films, a first removable support sheet having been removed from the first film and showing the first and capillary films being sprayed with a first solvent.

Referring to FIG. 4, the first removable transparent support sheet 22 is shown in full outline being removed from the exposure side 21 of the first film 20. This reveals the developed emulsion 19 containing the negative image 28 which has the voids 48 and which is relatively delicate. As was described with reference to FIG. 3, the development side 24 of the first film is adhered to the front side 43 of the capillary film, except in areas where the voids 48 of the image 28 removed portions of the emulsion 19. The combination of the emulsion 19 and capillary film is then sprayed with a fine mist of a second solvent 44, which can be water. The water is directed into the voids 48 of the negative image 28, so that the emulsion 38 on the front side 43 of the capillary film in areas corresponding to the voids 48 of the negative image is exposed to water and removed. As seen in FIG. 4, where water penetrates the voids 48, it produces spaces 46 in the emulsion 38 on the front side of the capillary film which is not shielded by the first film. In other words, the second solvent produces in the emulsion 38 a second negative image by washing away portions of the capillary film not protected by the emulsion 19, i.e. exposed by the voids, which produces corresponding spaces 46 in the emulsion 38. The emulsion originally within the spaces 46 must be washed away completely with the second solvent to provide the high resolution desired for grit blasting as will be described. It is added that a solvent other than water could be used but this solvent must be capable of removing the capillary film, and also must be compatible with the first film so as not to dissolve the negative image 28 on the first film.

The cooperation between the developed remnants of the emulsion 19 of the first film 20, and the emulsion 38 is such that the relatively weak first film 20 provides the negative image for the stronger capillary film while the films are sprayed with the second solvent. Portions of the capillary film emulsion 38 uncovered by the voids of the negative image can be washed away while the remaining portions of the film 40 remain intact. The first film emulsion, which is physically weaker than the capillary film emulsion, is insoluble in water, whereas the capillary film emulsion is soluble. Thus, if the capillary film emulsion were not protected or "anchored" by the first film emulsion, the capillary film emulsion would be washed away by the water. This cooperation provides an important and unobvious advantage.

Figure 5:
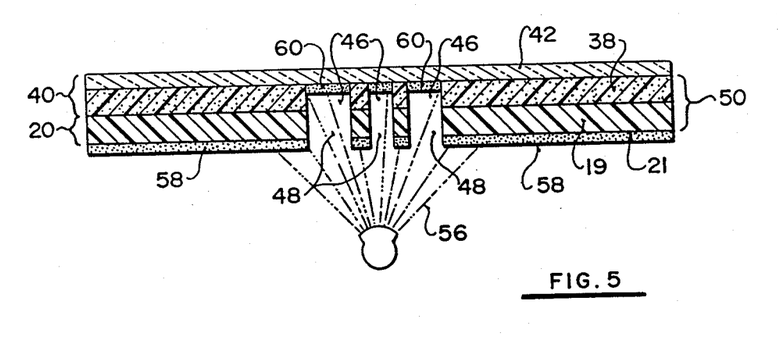
FIG. 5 is a view similar to FIG. 4, with the first and capillary films cooperating after being sprayed with the first solvent to produce a mask of the image, the mask shown while being sprayed with a second adhesion means.

Referring to FIG. 5, after complete washing, the combination of the two films provides a mask 50 which is still adhered to and supported by the second removable support sheet 42. The mask 50 of the negative image 28, which is adhered to the second removable transparent support sheet 42 is then dried. The mask 50 can be air dried or can be forced air dried using conventional heat dispensing means, for example a common, hand held hair dryer.

Figure 6:
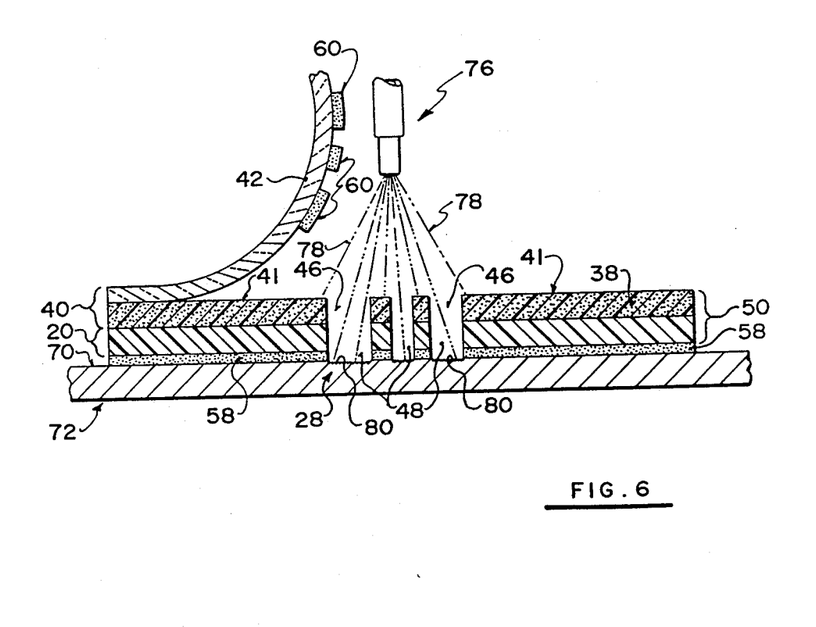
FIG. 6 is a view similar to FIG. 5, showing the mask of the image adhered to a surface of an article to be etched, a second removable transparent support sheet being partially removed from the capillary film and the mask being grit blasted so that the image is etched onto the surface.

Referring again to FIG. 5, the exposure side 21 of the first film 20 is now a first surface of the mask 50 which is then sprayed with a sprayable liquid adhesive, herein termed a second adhesion means 56. The second adhesion means 56 can be a product called MECANORMA (trade mark) MCC-164, made by Mecanorma Industries, a French company. The second adhesion means 56 adheres to two portions of the mask 50 namely the exposure side 21 where it is designated 58 and the voids 48. Adhesive passing into the voids 48 and the spaces 46 of the mask is termed "over-spray" of the second adhesion means and is designated 60. The overspray 60 adheres to the second removable transparent support sheet 42 but this is not important as it will be removed later with the second removable transparent support sheet 42 as seen in FIG. 6. The second adhesion means, when applied to the mask at 58, must have a greater affinity for the surface of the article to which the mask is to be adhered than the affinity between the capillary film and the second removable transparent support sheet 42. In other words, strength of the adhesion between the first surface of the mask and the article surface must be strongest than the adhesion between the capillary film and the second removable transparent support sheet.

As shown in FIG. 6, the mask 50 is then adhered to a surface 70 of an article 72 to be etched, so that the second adhesion means 58 on the side 21 is disposed between the surface 70 and the mask 50. The second removable transparent support sheet 42 (shown in full outline) is then removed from the mask 50, which exposes a second surface of the mask which is the rear side 41 of the capillary film 40. Any over-spray 60 from the second adhesive means which passed into the voids 48 adheres to the sheet 42 and thus is cleanly and easily removed before grit blasting, which contrasts with some prior art processes. The second removable transparent support sheet 42 can be removed quite readily because the second adhesion means 56, 58 has a greater affinity for the surface 70 to which the mask is adhered than the affinity between the capillary film 40 and the second removable transparent support sheet 42. The mask 50 therefore, remains adhered on the surface 70, and can then be grit blasted so that the negative image 28 is etched onto the surface 70 in positive. It can be seen that the rear side 41 of the capillary film 40 (i.e. the second surface of the mask) is now the outer surface of the mask, and thus is exposed to grit blasting.

FIG. 6 also shows a grit blasting device 76 propelling grit blasting material 78 to grit blast the mask 50. Steel grit, aluminum oxide, sand or other material can be used to grit blast through the mask 50 which functions similarly to a prior art mask, but with improved resolution. The outer surface of the mask is the capillary emulsion 38 which appears to have adequate resistance to abrasion from the grit blast material. The grit blasting material 78 which contacts the outer or second surface of the mask 50, rebounds off the mask 50 and does not etch the surface 70. The grit blasting material 78 which does not contact the mask 50 but instead penetrates the voids 48 and spaces 46 of the mask etches the surface 70 to produce an etched positive image as shown at 80. When the grit blasting is complete, the negative image 28, now in positive, is etched onto the surface 70 of the article 72. The mask 50 can then be easily removed from the surface 70.

ALTERNATIVES

Figure 7:
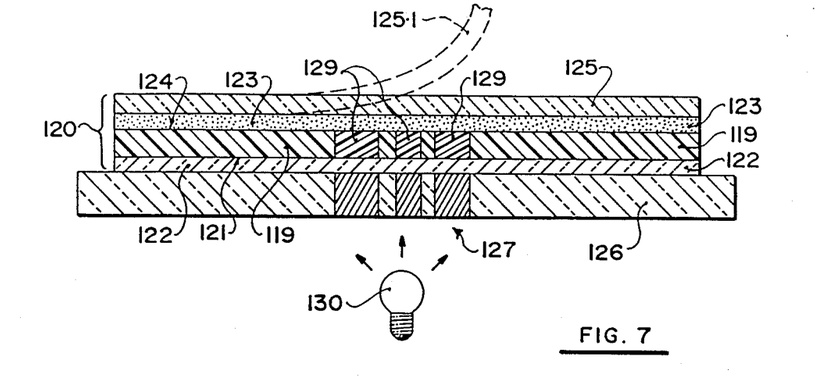
FIG. 7 is an end view of an alternative embodiment showing a similar first film being exposed through a positive image bearing transparency to actinic light with a protective sheet shown partially removed.
Figure 8:
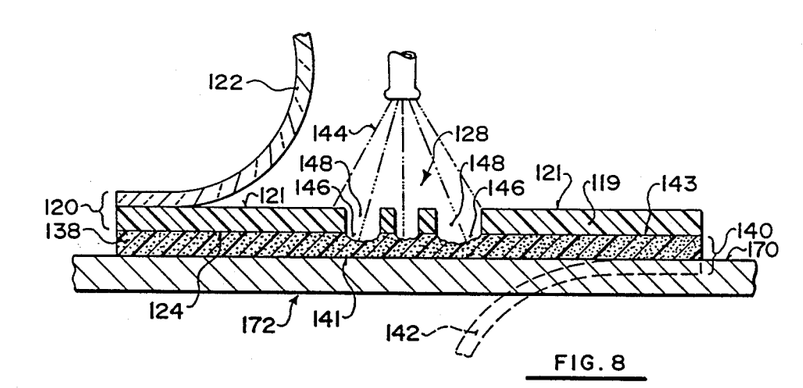
FIG. 8 is an end view of the alternative embodiment showing a rear side of a capillary film adhered to a surface of an article, a development side of the first film of FIG. 7 being shown adhered to a front side of the capillary film, a first removable transparent support sheet being shown partially removed from an exposure side of the first film, the films, adhered together and, after removal of a second removable support sheet, being shown adhered to the surface to be etched being sprayed with a fine mist of a second solvent.
Figure 9:
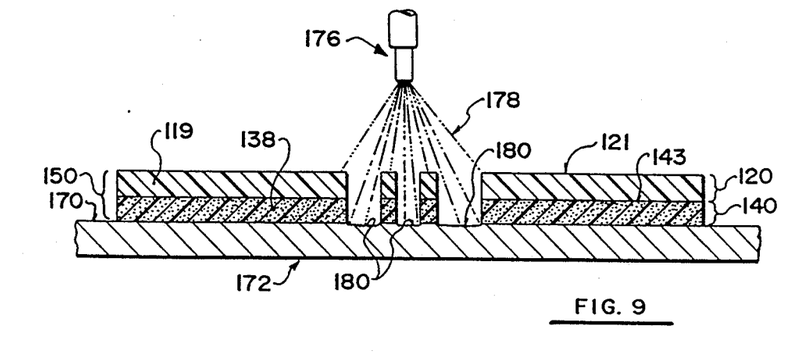
FIG. 9 is a view similar to FIG. 8, showing the first and capillary films cooperating after being sprayed with a fine mist of the second solvent to produce a mask of the image, the mask being grit blasted so that the image is etched onto the surface.

FIGS. 7–9

An alternative or second embodiment can be used in applications when the first solvent will not effect the surface to be etched, i.e. the article is inert, such as glass. The films, solvents and adhesives can be identical to those used in the previously described embodiment.

FIG. 7 shows a first film which is exposed and developed in a manner similar to the first film 20 of FIG. 1. However, for ease of understanding the remaining steps, shown in FIGS. 8 and 9, a new set of reference numerals have been employed.

In the second embodiment of the invention, a first step of the method of etching a surface of an article is shown in FIG. 7. The method includes exposing an exposure side 121 of a first film 120 through an image bearing transparency 126 to actinic light 130. The transparency bears a positive image 127 and, after exposure, a latent image 129 is formed in the photosensitive emulsion 119 of the first film 120. The first film has an adhesive protective layer 123 adjacent a development side 124 of the film which is opposite to the exposure side 121. The first film 120 has a first removal transparent support sheet 122 which supports the photosensitive emulsion 119 and is adhered to the exposure side 121 thereof. The film 120 also has a protective sheet 125 which protects the protective layer 123 and the development side of the first film. After the film is exposed, the sheet 125 is peeled away, as shown in broken outline at 125.1, from adjacent the development side 124 of the first film to which it is adhered, thus revealing the layer 123. The development side 124 of the film 120 is now rinsed with a first solvent, which can be water, so as to remove the layer 123, and is then treated with a developing means. If the first film is the I-N-T film, then it would be developed with the appropriate 3M Company developer. After development, the first film 120 is further rinsed with the first solvent to remove the development means and the undeveloped emulsion so as to produce a negative image 128 in remanants of the emulsion, after which the first film is allowed to dry.

As seen in FIG. 8, a capillary or second film 140 is selected and cut to size. The capillary film has a second removable transparent support sheet 142 which supports a capillary emulsion 138 on a rear side 141 of the capillary film. In FIG. 8, the sheet 142 is shown in broken outline partially removed from the capillary film. After the sheet 142 is completely removed from the capillary film, thus revealing the emulsion 138, the rear side of the capillary film is adhered to a dampened surface 170 of an article 172 to be etched. Water has been previously applied to the surface 170 which permits the rear side 141 of the capillary film to adhere to the surface 170, thus providing a third adhesion means, although a separate adhesive can be used.

The development side 124 of the first film 120 is then adhered to a front side 143 of the capillary film 140 with the first adhesion means. The first adhesion means, as mentioned above, is the existing or integral adhesive on the development side 124 of the first film 120. This adhesion means is activated when the protective sheet 125 is removed from the development side 124 of the first film prior to development thereof. As in the first embodiment, the development side 124 of the photosensitive emulsion 119 is brought into intimate contact with the front side 143 of the capillary emulsion 138. The first adhesive means must have a great affinity for the first film 120 to which the capillary film is adhered than the affinity between the first film 120 and the first removable support sheet 122.

As seen in FIG. 8, the first removable transparent support sheet 122 is then removed from the exposure side 121 of the film 120. The emulsions 119 and 138 of the film 120s and 140, adhered together and adhered to the surface 170, are then sprayed with a fine mist of a second solvent 144. The second solvent removes portions of the capillary emulsion 138 which are not covered by the emulsion 119 of the first film, i.e. the second solvent produces spaces 146 in the emulsion 138 which are exposed by voids 148 in the negative image 128. Selective removal of the emulsion 138 creates a second negative image in the capillary film 140 corresponding to the negative image 128 in the first film 120. The second solvent 144 can be water or any other solvent compatible with the surface 170 and with the film 120 and 140, so as not to dissolve the negative image 128 borne by the first film 120.

As shown in FIG. 9, the films 120 and 140 are thus adhered together and adhered to the surface 170 to form a mask 150 ready for grit blasting. In contrast with the first embodiment of the invention, the exposure side 121 of the first film 120 now forms the outer surface of the mask. Also, in contrast with the first embodiment, a separate third adhesive means is not required. FIG. 9 shows the mask 150 being grit blasted with grit blasting material 178 from a device 176, so that the negative image 128 is etched onto the surface 170 in positive, as shown at 180. Finally, after grit blasting the surface, the mask 150 is removed from the surface 170. The first film 120 has less resistance to abrasion by the grit than the capillary film 40 of the first embodiment, and thus is quickly destroyed. However, the remaining portion of the capillary film 140 can withstand the grit blasting for sufficient time to permit the surface to be etched.

In summary, it can be seen that two major differences between the first and second embodiments of FIGS. 1-6, and 7-9 are as follows. In the first embodiment, the film are processed and bonded together remote from the article, and thus the solvents do not contact the article. This embodiment would be appropriate where the article is affected by the solvents, for example if the solvent is water and the article to be grit blasted is wood, or if the solvent is a hydrocarbon, and the article to be etched is a plastic that is dissolved by the hydrocarbon. Also, in the first embodiment, the outer surface of the mask that is exposed to the grit blast material is the rear side 41 of the capillary film.

In contrast, in the second embodiment, the first film 120 is initially exposed and developed remote from the capillary film. The capillary film by itself is adhered to the surface to be etched, and the first film is then adhered to the capillary film which has been previously bonded to the article. In this way, the outer surface of the mask is the exposure side 121 of the first film.

It can be seen that the combination of the capillary film and the first film act together to produce a mask, and either surface of this combination of films can be exposed to grit blasting, or can be adhered to the surface to be grit blasted. This result is considered to be unexpected and unobvious, because either film by itself could not be used to produce a mask from a negative image which could provide high resolution with sufficient toughness to resist grit blasting for a length of time necessary to etch an article. Thus the two films act in concert to produce by a fast and simple technique a new and useful mask which results in far higher resolution than previous masks produced by photochemical methods known to the applicant. The present invention uses easily available commercial films which are sequentially bonded together so that emulsions of each film are brought into intimate contact with each other, and when so contacted, provide the unexpected results of the invention.

A third embodiment of the present invention differs from the two previously described embodiments in that the emulsion of the first film has a negative image therein prior to commencing the process. The third embodiment is similar to the first embodiment in most other respects. The description following refers to FIGS. 1-6, with appropriate differences as outlined above.

In this embodiment, the exposure side of the first film 20 is exposed through a positive image bearing transparency to actinic light so that a latent image is formed on the first film. The first film 20 is developed so that there is a negative image therein, which film is hereafter termed the "image bearing film". Alternatively, the image bearing film can be purchased with the negative image formed therein. The image bearing film in this embodiment is the I-N-T film, the MECANORMA film or the CHROMATEC transfer film. The image bearing film has an emulsion bearing the image and is adapted to cooperate with a capillary film when the films are sprayed with a solvent to produce a mask of the image which can withstand grit blasting.

In the third embodiment of the present invention, the method of etching a surface of an article comprises adhering the image bearing film to the capillary film 40 using the first adhesion means as shown in FIG. 3. The image bearing film has the first removable transparent support sheet 22 adhered to the exposure side 21 thereof.

The capillary film 40 has a second removable transparent support sheet 42 adhered to the rear side 41 of the capillary film 40 as shown in FIG. 3. The development side 24 of the image bearing film 20 is then carefully adhered to the front side 43 of the capillary film 40 by rub-transferring and with the first adhesion means thus forming a combination of the two films.

The first removable transparent support sheet 22 is then removed from the image bearing film. As shown in FIG. 4, the image bearing film and the capillary film 40 are then sprayed with the solvent 44, such as water. This creates a negative image in the capillary film corresponding to the negative image in the negative image bearing film. The films are thus adhered together and adhered to the second removable transparent support sheet 42 as a mask 50, as shown in FIG. 5. The solvent can be any other solvent compatible with the image bearing film so as not to dissolve the image in the image bearing film. The mask 50 which is adhered to the second removable transparent support sheet 42 is then dried and the mask is then sprayed with the second adhesion means 56 as shown in FIG. 5. The second adhesion means, when applied to the mask, must have a greater affinity for the surface to which the mask is to be adhered than the affinity between the capillary film 40 and the second removable transparent support sheet. The mask 50 is then adhered to the surface 70, as shown in FIG. 6, and the second removable transparent support sheet 42 is removed from the mask. The mask is then grit blasted using the grit blasting material so that the image is etched onto the surface in positive. The mask is then removed from the surface.

A fourth embodiment of the invention differs from the three previously described embodiments in that, as in the third embodiment, the emulsion of the first film has a negative image therein prior to commencing the process. The fourth embodiment is similar to the second embodiment in most other respects. The fourth embodiment is described with reference to FIGS. 7–9 with differences outlined below.

In the fourth embodiment of the present invention, the method of etching a surface of an article comprises removing the second removable transparent support sheet 142 from the rear side 141 of the capillary film 140. The rear side 141 of the capillary film 140 is then adhered to the surface 170 of the article 172, as shown in FIG. 8, with the third adhesion means. The third adhesion means comprises dampening the surface 170 with water. A negative image bearing film, having a first removable transparent support sheet 122 adhered to the exposure side 121 thereof, is then carefully adhered to the front side 143 of the capillary film 140 by rub-transferring with the first adhesion means, thus forming the combination of films.

FIG. 8 shows the development side 124 of the image bearing film adhered to the front side 143 of the capillary film. The first adhesion means must have a greater affinity for the image bearing film to which the capillary film is to be adhered than the affinity between the image bearing film and the first removable transparent support sheet. The first removable transparent support sheet 122 is then removed from the image bearing film, and the emulsions of the films, adhered together and adhered to the surface, are sprayed with the solvent. This creates a negative image in the emulsion 138 of the capillary film corresponding to the negative image in the negative image bearing film. The films are thus adhered together and adhered to the surface as a mask 150, as shown in FIG. 9. The solvent in this case can be water or any other solvent compatible with the surface 170 and with the image bearing film so as not to dissolve the image that is in the image bearing film. The mask is then grit blasted using the grit blasting material 178 so that the image is etched onto the surface in positive as at 180 and the mask is then removed from the surface.

It is to be understood that the invention is not confined to the invention as herein illustrated and described but embraces all such modifications thereof which come within the scope of the claims appended hereto.

What is claimed is:

1. A method of etching a surface of an article which comprises:
    (a) providing a negative image bearing film having a development side and an exposure side, and a first removable transparent support sheet adhered to the exposure side thereof; and providing a second film having front and rear sides, and a second removeable support sheet adhered to the rear side thereof;
    (b) removing the second removeable support sheet from the rear side of the second film and adhering the rear side of the second film to the surface to be etched with a third adhesion means;
    (c) adhering the development side of the image bearing film to the front side of the second film with a first adhesion means, the first adhesion means having a greater affinity for the image bearing film to which the second film is adhered than the affinity between the image bearing film and the first removeable transparent support sheet;
    (d) adhering the first removeable transparent support sheet from the exposure side of the image bearing film;
    (e) applying a solvent to the image bearing and second films when adhered together and adhered to the surface, so that a second negative image is created in the second film, the second negative image corresponding to the negative image in the negative image bearing film, the films being adhered to the surface as a mask which can withstand grit blasting;
    (f) grit blasting the mask so that the image is etched onto the surface in positive; and
    (h) removing the mask from the surface.

2. A method of etching a surface of an article as claimed in claim 1, wherein the solvent is water.

3. A method of etching a surface of an article as claimed in claim 1 further characterized by:
    (a) applying the solvent to the adhered image bearing film and the second film by spraying.

4. A method of etching a surface of an article which comprises:
    (a) exposing an exposure side of a first film through a positive imaged bearing transparency to actinic light so that a latent image is formed on the first film, the first film having a first removable transparent support sheet adhered to the exposure side opposite a development side;

(b) rinsing the first film with developing means for developing the first film to produce a first negative image on the first film, then rinsing with a first solvent to remove the developing means and then allowing the first film to dry;

(c) removing a second removable support sheet from a rear side of a second film to which it is adhered;

(d) adhering the rear side of the second film to the surface to be etched with a third adhesion means;

(e) adhering the development side of the first film to a front side of the second film with a first adhesion means, the first adhesion means having a greater affinity for the first film to which the second film is to be adhered than the affinity between the first film and the first removable transparent support sheet;

(f) removing the first removable transparent support sheet from the exposure side of the first film;

(g) applying a second solvent to the first and second films when adhered together and adhered to the surface, so that a second negative image is created in the second film, the second negative image corresponding to the first negative image, the films being adhered to the surface as a mask;

(h) grit blasting the mask so that the image is etched onto the surface of the article in positive; and (i) removing the mask from the surface.

5. A method of etching a surface of an article as claimed in claim 4 further including:

(a) prior to rinsing with developing means, rinsing the first film with the first solvent.

6. A method of etching a surface of an article as claimed in claim 4, wherein the first and second solvents are water.

7. A method of etching a surface of an article as claimed in claim 4 further characterized by:

(a) applying the second adhesion means to the mask by spraying.

8. A method of etching of a surface of an article as claimed in claim 4 further characterized by:

(a) applying the second solvent by spraying.

9. A mask for grit blast etching an image onto a surface of an article, the mask comprising:

(a) an image bearing film having transparent portions and opaque portions, the image bearing film having an emulsion, an exposure side and a development side, the film having a first removeable transparent support sheet supporting the emulsion;

(b) a second film having an emulsion, a front side and rear side and having a second removeable support sheet supporting the emulsion, the front side of the second film being adhered to the development side of the image bearing film by a first adhesion means so that emulsions of the films are disposed between the first and second removeable support sheets and can cooperate with each other when a support sheet is removed and a solvent is applied to the films to produce a second image in the second film, the second image corresponding to the negative image in the image bearing film, the films being adhered together to produce a mask of the image which can withstand grit blasting.

10. A mask for grit blast etching a surface of an article as claimed in claim 9, further including second adhesion means for adhering the mask of the image to the surface to be etched, the second adhesion means, when applied to the mask, having a greater affinity for the surface to which the mask is to be adhered than the affinity between the second film and the second removable support sheet, whereby when the mask of the image is adhered to the surface, the second removable support sheet can be removed from the mask so that the mask of the image can be grit blasted by an abrasive so that the image can be etched onto the surface in positive.

11. A mask for grit blast etching a surface of an article as claimed in claim 9, wherein the solvent is water.

12. A method of making a mask for etching a surface of an article, the method including:

(a) adhering a development side of a negative image bearing film, having a first removable transparent support sheet adhered to an exposure side thereof, to a front side of a second film using a first adhesion means, the second film having a second removable support sheet adhered to a rear side thereof;

(b) removing the first removable transparent support sheet from the exposure side of the image bearing film;

(c) apply a solvent to the image bearing and second films so that a second negative image is created in the second film, the second negative image corresponding to the negative image in the negative image bearing film, the films being adhered to the second removable support sheet as a mask;

(d) drying the mask which is adhered to the second removable support sheet;

(e) applying to the mask a second adhesion means, the second adhesion means, when applied to the mask, having a greater affinity for the surface to which the mask is to be adhered than the affinity between the second film and the second removable support sheet.

13. A method as claimed in claim 12 further including:

(a) adhering the mask to the surface to be etched and removing the second removable support sheet from the mask;

(b) grit blasting the mask so that the image is etched onto the surface in positive; and (c) removing the mask from the surface.

14. A method as claimed in claim 12 further characterized by:

(a) applying the second adhesion means to the mask by spraying.

15. A method as claimed in claim 12 further characterized by:

(a) applying the solvent to the adhered films by spraying.

16. A method of making a mask for etching a surface of an article, the method including:

(a) exposing an exposure side of a first film through a positive image bearing transparency to actinic light so that a latent image is formed on the first film, the first film having a first removable transparent support sheet adhered to the exposure side opposite a development side;

(b) rinsing the first film with developing means for developing the first film to produce a first negative image on the first film, then rinsing with a first solvent to remove the developing means and then allowing the first film to dry;

(c) adhering the development side of the first film to a front side of a second film using a first adhesion means, the second film having a second removable support sheet adhered to a rear side thereof;

(d) removing the first removable transparent support sheet from the exposure side of the first film;

(e) applying to the first film and the second film a second solvent so that a second negative image is created in the second film, the second negative image corresponding to the first negative image, the films being adhered to the second removable support sheet as a mask;

(f) drying the mask which is adhered to the second removable support sheet;

(g) applying a second adhesion means to the mask, the second adhesion means, when applied to the mask, having a greater affinity for the surface to which the mask is to be adhered than the affinity between the second film and the second removable support sheet.

17. A method as claim in claim 1 further including:

(a) adhering the mask to the surface to be etched and removing the second removable support sheet from the mask;

(b) grit blasting the mask so that the image is etched onto the surface of the article in positive; and (c) removing the mask from the surface.

18. A method as claimed in claim 1 further including:

(a) prior to rinsing with developing means, rinsing the first film with the first solvent.

19. A method as claimed in claim 1 further characterized by:

(a) applying the second adhesion means to the mask by spraying.

20. A method as claimed in claim 1 further characterized by:

(a) applying the second solvent by spraying.

* * * * *